United States Patent
Naeem et al.

(12) 
(10) Patent No.: US 6,464,806 B1
(45) Date of Patent: Oct. 15, 2002

(54) METHOD OF FORMING EXTRUDED STRUCTURES FROM POLYCRYSTALLINE MATERIALS AND DEVICES FORMED THEREBY

(75) Inventors: Munir D. Naeem, Poughkeepsie; Lawrence A. Clevenger, Lagrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/543,377

(22) Filed: Apr. 5, 2000

(51) Int. Cl.[7] .............................. C22F 1/04; C22F 1/08; C22F 1/16
(52) U.S. Cl. ...................... 148/559; 148/656; 148/679; 148/689
(58) Field of Search ................................. 148/559, 656, 148/679, 688, 689

(56) References Cited

U.S. PATENT DOCUMENTS 4,921,549 A * 5/1990 Austin ........................ 148/656

* cited by examiner

Primary Examiner—George Wyszomierski
(74) Attorney, Agent, or Firm—Casey P. August; Gary M. Hartman; Domenica N. S. Hartman

(57) ABSTRACT

A method of forming extruded structures from a polycrystalline material and structures formed thereby. The method generally entails forming a structure that comprises a polycrystalline material constrained by a second material in all but one direction, with the polycrystalline material having a patterned surface that is normal to the one direction. The polycrystalline material is then selectively heated, during which the second material restricts thermal expansion of the polycrystalline material in all but the one direction normal to the surface of the polycrystalline material. As a result, stresses are induced in the polycrystalline material that cause grain growth from the surface of the polycrystalline material in the one direction. The growth of an individual grain produces an extruded structure that projects above the surface of the polycrystalline material. When appropriately configured, nano-scale structures formed in accordance with this invention can be an operative component of a wide variety of devices, including digital recording media.

16 Claims, 1 Drawing Sheet

METHOD OF FORMING EXTRUDED STRUCTURES FROM POLYCRYSTALLINE MATERIALS AND DEVICES FORMED THEREBY

BACKGROUND OF THE INVENTION

1. Field of the Invention

The present invention generally relates to the fabrication of microscale structures, such as structures and devices for microelectronics applications. More particularly, this invention relates to a method of forming extruded structures by initiating selective grain growth in polycrystalline materials, and devices with such structures for use in microelectronics applications.

2. Description of the Prior Art

In the past, conventional lithographic techniques have been used to produce various structural features, such as metal pads and lines for microelectronic applications. While lithographic techniques are widely and successfully used in the art, nano-scale features (i.e., operative structures and components that have a controlled dimension of less than ten nanometers) are difficult to form by conventional lithography. In view of the demand for greater miniaturization of microcircuits and their components, it would be desirable if a method were available that enabled the patterning of metallization to form nano-scale features. In addition to metal pads for microelectronic applications, a wide variety of electronic components and devices could benefit or utilize nano-scale features, including digital recording media.

SUMMARY OF THE INVENTION

The present invention provides a method of forming extruded structures from a polycrystalline material and structures formed thereby. A key aspect of the invention is the determination of the mechanism by which selective grain growth can be induced and controlled in a polycrystalline material that is constrained in all but one direction. This mechanism is believed to involve the growth of grains that have been formed by patterning and/or appropriate deposition techniques to have fewer than six grain boundaries, six grain boundaries being the most thermodynamically stable grain structure. If sufficiently heated, those grains located at a patterned surface of the polycrystalline material and having fewer than six boundaries will undergo grain growth in a direction normal to the patterned surface. If constrained during heating, as is the case if all but the patterned surface of the polycrystalline material contacts and is contained by a second material with a lower coefficient of thermal expansion (CTE), compressive stresses induced by the second material will cause this grain growth to be predominantly outward and normal to the patterned surface of the polycrystalline material.

In view of the above, the method of this invention generally entails forming a structure that comprises a polycrystalline material constrained by a constraining material in all but one direction, with the polycrystalline material having a surface that is normal to the one direction. The polycrystalline material is then selectively heated, during which the constraining material restricts thermal expansion of the polycrystalline material in all but the one direction normal to the surface of the polycrystalline material. As a result, stresses are induced in the polycrystalline material that lead to grain growth from the surface of the polycrystalline material in the one direction. The growth of an individual grain produces an extruded structure that projects above the surface of the polycrystalline material. Sufficient grain growth can occur to produce extruded structures which are, based on an average grain size of, for example, about four $\mu$m, nano-scale structures on the surface of the polycrystalline material. (As defined herein, nano-scale designates a structure with at least one dimension that is less than ten nanometers.) When appropriately configured, nano-scale structures formed in accordance with this invention can be an operative component of a wide variety of devices, including digital recording media.

Other objects and advantages of this invention will be better appreciated from the following detailed description.

DETAILED DESCRIPTION OF THE PREFERRED EMBODIMENT

Figure 1:
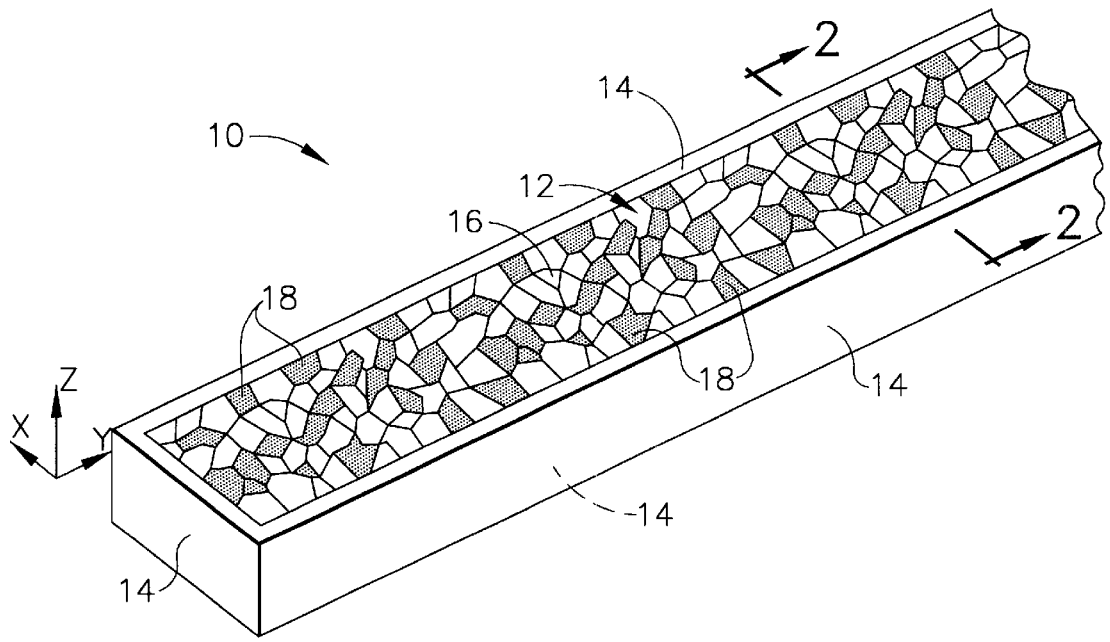
FIG. 1 represents a perspective view of a multimaterial structure that defines digital recording media in accordance with an embodiment of the present invention.

The present invention is directed to a process for forming nano-scale structures or components from multimaterial structures that include a polycrystalline material constrained by a second material. For illustrative purposes, the invention will be described in terms of a process for forming a multimaterial structure that defines digital recording media 10 shown in FIG. 1, with a polycrystalline material 12 being surrounded and contained by a constraining material 14 at all but one surface 16 of the polycrystalline material 12. From the following discussion, those skilled in the art will appreciate that a wide variety of materials and material combinations can be employed for the polycrystalline and constraining materials 12 and 14 of the multimaterial structure, including dielectric, conductive and semiconductive materials. As will also become apparent, the basic material requirements for a multimaterial structure suitable for use with the teachings of this invention are that a first material has a polycrystalline grain structure, and that at least one other material contacting the first material has a coefficient of thermal expansion (CTE) that is sufficiently lower than the first material such that, when the multimaterial structure is sufficiently heated, stresses are induced within the polycrystalline material to initiate grain growth from an unconstrained surface of the polycrystalline material.

The digital recording media 10 is shown in FIG. 1 as having a rectilinear shape, though other and nonrectilinear shapes are possible. As is known in the art, polycrystalline aluminum-copper, tungsten and copper alloys are widely used to form circuit interconnect metallizations, and could be employed as the polycrystalline material 12 for the recording media 10. However, the invention is generally applicable to any polycrystalline material, including metals, metal alloys, and semiconductor materials. For use with a polycrystalline material 12 used as circuit metallization, suitable materials for the constraining material 14 include conventional diffusion barrier materials used in circuit metallizations, such as titanium, titanium nitride and combinations of both. Other suitable materials for the constraining material 14 include oxides, nitrides, metals and metal alloys, semiconductor materials, dielectrics, as well as other materials that will provide a sufficient CTE mismatch. In contrast to the polycrystalline material 12, the constraining material 14 can have an amorphous, polycrystalline or single crystal microstructure. The dimensions of the recording media 10 can vary, with thicknesses (z-axis) of about 0.25 µm and less being particularly suitable, though greater thicknesses could be used. The dimensions of the recording media 10 and its materials 12 and 14 are not particularly critical, as long as sufficient stresses can be induced through a CTE mismatch to cause the desired grain growth in the polycrystalline material 12.

According to this invention, grain growth has been found to occur with polycrystalline materials that have been patterned to expose grain fragments 18 at the patterned surface, schematically represented as dark grains at the surface 16 in FIG. 1. FIG. 1 represents the typical polycrystalline grain structure of materials deposited by such methods as electroplating, sputtering, evaporation, chemical or physical vapor deposition, etc. The grain structure and texture of the polycrystalline material 12 will depend on many factors, including deposition conditions and the type of substrate and barrier materials used. In one example, the average grain size of a polycrystalline Al—Cu alloy may be on the order of about 0.005 to about 20 µm if deposited by electroplating, sputtering, evaporation, or chemical or physical vapor deposition. The surface 16 of the polycrystalline material 12 has been patterned by any suitable method, such as lithography followed by reactive ion (RIE), wet or dry etching, to expose the grain fragments 18 at the patterned surface 16 as a result of grains being sectioned by the patterning process.

Figure 2:
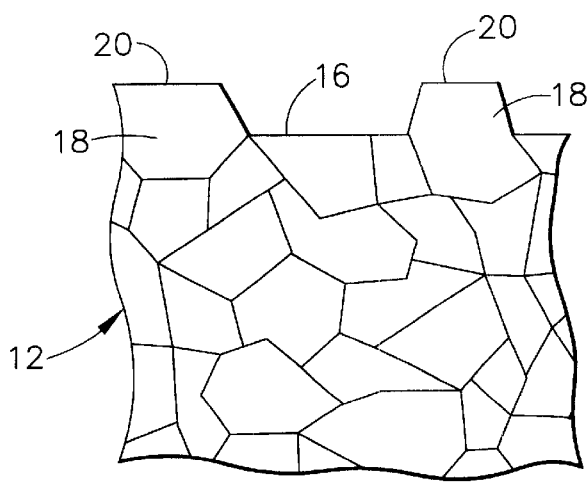
FIG. 2 represents a fragmentary cross-sectional view of the multimaterial structure of FIG. 1.

FIG. 2 represents the effect of selectively and locally heating the surface 16, such as with a laser, electrical probe current, or any other suitable energy input, to cause sufficient grain growth of the grain fragments 18 to yield nano-scale extruded structures 20. According to this invention, the extruded structures 20 are the result of stress conditions in the polycrystalline material 12 during the localized heat treatment. For example, by forming the polycrystalline material 12 of an Al—Cu alloy and the constraining material 14 of titanium and/or titanium nitride, which have lower coefficients of thermal expansion than Al—Cu alloys, the constraining material 14 physically constrains the polycrystalline material 12 when the material 12 is heated. As a result of the patterning process, many of the grains at the patterned surface 16 of the polycrystalline material 12 are left with greater or fewer than six grain boundaries. According to this invention, grain fragments 18, i.e., those grains with fewer than six grain boundaries as a result of the patterning process, are unstable and, if sufficiently heated, subject to grain growth in a direction normal to the surface 16 (the z-direction in FIG. 1) as a result of the constraining material 14 inhibiting grain growth and thermal expansion of the polycrystalline material 12 in the other directions (the x and y-directions in FIG. 1). Models such as Mullins-Von Neumann can be used to predict the grain growth under such conditions. Based on grain growth modeling, when the surface 16 of the polycrystalline material 12 is sufficiently heated to a temperature below the melting point of the material 12, e.g., to a temperature of about 200° C. to about 300° C. for Al—Cu alloys, those grains 18 with less than six grain boundaries are likely to grow and effectively form a nano-scale extruded structure 20 with six or more grain boundaries. The extruded structure 20 will project from the surface 16 of the polycrystalline material 12 a distance that is typically less than or equal to the average grain size of the polycrystalline material 12.

As evident from FIG. 1, the extruded structures 20 can be selectively formed on the surface 16 of the polycrystalline material 12 according to a pattern for recording information in a digital format. For example, the information can be correlated with x-y coordinates on the surface 16 of the polycrystalline material 12. Grains at the appropriate x and y coordinates can then be selectively heated by a suitably programmed energy input device to grow in the z-direction, yielding nano-scale extruded structures 20 that represent "1" as opposed to "0" for the remainder of the surface 16, corresponding to the nonextruded grains along the same recording band on the surface 16. Thereafter, this information and be read from the surface 16 of the polycrystalline material 12 using any suitable surface topography sensing equipment, including microscopes.

While the invention has been described in terms of preferred embodiments, it is apparent that other forms could be adopted by one skilled in the art. For example, while described with reference to certain materials and applications, the teachings of this invention are applicable to a wide variety of applications that might employ essentially any type of material (e.g., conductive, dielectric or semiconductive). Accordingly, the scope of the invention is to be limited only by the following claims.

What is claimed is:

1. A method of forming nano-scale extruded structures from a polycrystalline material, the method comprising the steps of:

forming a structure comprising a polycrystalline material constrained by a constraining material in all directions but one direction, the polycrystalline material having a surface that is normal to the one direction; and then selectively heating the polycrystalline material during which the constraining material restricts thermal expansion of the polycrystalline material in all directions but the one direction normal to the surface of the polycrystalline material, such that stresses are induced in the polycrystalline material that cause grain growth from the surface of the polycrystalline material in the one direction, the grain growth producing at least one nano-scale extruded structure projecting above the surface of the polycrystalline material.

2. A method according to claim 1, further comprising the step of patterning the structure to form the surface of the polycrystalline material, the patterning step removing portions of grains of the polycrystalline material so that grain fragments are exposed at the surface of the polycrystalline material, the extruded structure growing from one of the grain fragments exposed at the surface.

3. A method according to claim 1, wherein the selective heating step produces a plurality of extruded structures that project above the surface of the polycrystalline material.

4. A method according to claim 3, wherein the selective heating step is carried out to record information by selectively causing extruded structures to form at predetermined locations on the surface of the polycrystalline material, the information being recorded in reference to the locations of the extruded structures on the surface of the polycrystalline material.

5. A method according to claim 4, further comprising the step of reading the information recorded on the surface of the polycrystalline material.

6. A method according to claim 1, wherein the polycrystalline material comprises grains having a size distribution characterized by an average grain size, and the extruded structure projects from the surface of the polycrystalline material a distance that is less than or equal to the average grain size of the polycrystalline material.

7. A method according to claim 1, wherein the polycrystalline material is chosen from the group consisting of metals, metal alloys and semiconductor materials.

8. A method according to claim 1, wherein the constraining material is chosen from the group consisting of titanium, titanium nitride, and combinations thereof.

9. A method according to claim 1, wherein the polycrystalline material has five surfaces constrained and contacted by the constraining material.

10. A method of forming nano-scale extruded structures from a polycrystalline material to produce a digital recording media, the method comprising the steps of:

forming a structure comprising a polycrystalline material constrained by a constraining material in all directions but one direction, the polycrystalline material having a surface that is normal to the one direction, the constraining material having a lower coefficient of thermal expansion than the polycrystalline material;

correlating information with x-y coordinates on the surface of the polycrystalline material; and then selectively heating the polycrystalline material at x-y coordinates corresponding to the information, during which the constraining material restricts thermal expansion of the polycrystalline material in all directions but the one direction normal to the surface of the polycrystalline material, such that stresses are induced in the polycrystalline material that cause grain growth from the surface of the polycrystalline material in the one direction, the grain growth producing a plurality of nano-scale extruded structures at the x-y coordinates that project above the surface of the polycrystalline material.

11. A method according to claim 10, further comprising the step of patterning the structure to form the surface of the polycrystalline material, the patterning step removing portions of grains of the polycrystalline material so that grain fragments are exposed at the surface of the polycrystalline material, the extruded structures growing from grain fragments selectively heated on the surface.

12. A method according to claim 10, further comprising the step of reading the information recorded on the surface of the polycrystalline material.

13. A method according to claim 10, wherein the polycrystalline material comprises grains having a size distribution characterized by an average grain size, and the extruded structures project from the surface of the polycrystalline material distances that are less or equal to than the average grain size of the polycrystalline material.

14. A method according to claim 10, where in the polycrystalline material is chosen from the group consisting of metals, metal alloys and semiconductor materials.

15. A method according to claim 10, wherein the constraining material is chosen from the group consisting of titanium, titanium nitride, and combinations thereof.

16. A method according to claim 10, wherein the polycrystalline material has five surfaces constrained and contacted by the constraining material.

\* \* \* \* \*